(12) United States Patent
Chen et al.

(10) Patent No.: US 7,405,456 B2
(45) Date of Patent: Jul. 29, 2008

(54) OPTICAL SENSOR CHIP PACKAGE

(75) Inventors: Po-Hung Chen, Shin-Chu (TW);
Chin-Cheng Lo, Shin-Chu (TW);
Mao-Jung Chen, Shin-Chu (TW)

(73) Assignee: Sigurd Microelectronics Corp.,
Shin-Chu (TW)

( * ) Notice: Subject to any disclaimer, the term of this patent is extended or adjusted under 35 U.S.C. 154(b) by 505 days.

(21) Appl. No.: 11/225,077

(22) Filed: Sep. 14, 2005

(65) Prior Publication Data

US 2007/0090504 A1  Apr. 26, 2007

(51) Int. Cl.
*H01L 29/40* (2006.01)

(52) U.S. Cl. .................. 257/434; 257/778
(58) Field of Classification Search .......... 257/434, 257/443, 457, 778
See application file for complete search history.

(56) References Cited

U.S. PATENT DOCUMENTS

| 5,867,368 | A  | * | 2/1999 | Glenn ................. 361/783 |
| 6,774,481 | B2 | * | 8/2004 | Ono ................... 257/704 |
| 6,984,866 | B1 | * | 1/2006 | Mostafazadeh et al. ..... 257/433 |
| 7,030,471 | B2 | * | 4/2006 | Perillat ................ 257/666 |

* cited by examiner

*Primary Examiner*—Roy K Potter
(74) *Attorney, Agent, or Firm*—Rosenberg, Klein & Lee

(57) ABSTRACT

The present invention relates to an optical sensor chip package in a cavity of forming frame thereof and has a gap between protection layer and optical sensor chip. The optical sensor chip avoids accepting the pressure from protection layer that damage the reliability between pads and metallic traces when protection layer lay on the forming frame. It improves drawbacks of the glue pass trough the gap between optical sensor chip and pads into the optical sensor area of optical sensor chip. It improves the high process yield and reduces the height of optical sensor chip package to achieve lightly and thinly.

20 Claims, 4 Drawing Sheets

OPTICAL SENSOR CHIP PACKAGE

BACKGROUND OF THE INVENTION

1. Field of the Invention

The present invention relates to optical sensor package, more specifically, the present invention improves the optical sensor chip to get more higher process yield.

2. Description of Prior Art

Traditional optical sensor chip package as shown in FIG. 1, it consist of material slice 12 and optical sensor chip 18 by electrical connection. A forming frame 10 forms a cavity and cover material slice 12 which provide open window 14 pass through the light source. The light transparent layer 16 covers in top of open window 14 of forming frame 10. An optical sensor chip 18 uses method of flip chip lie in the middle of the cavity of forming frame 10. Then it has electrical connection with material slice 12. Glue 20 cover optical sensor chip 18 and glue to cavity of forming frame 10.

The Taiwan public patent number 549598 mentions the above-mentioned method of package "optical sensor structure improvement". An optical sensor chip 18 uses method of flip chip lie in the middle of the cavity of forming frame 10. Then it achieves thin and light.

But traditional method of package has a drawback. An optical sensor chip 18 uses method of flip chip lie in the middle of the cavity of forming frame 10. Then it has electrical connection with material slice 12. It has a gap between pad 22 and an optical sensor ship 18. But the pad 22 in top of optical sensor chip 18 is very close to optical sensor area 24. When the glue stuff into the pad, the glue flow into optical sensor area 24 of optical sensor chip 18 from gap between optical sensor chip 18 and pad 22, it forms a un-wanted particle source that isn't easy cleaning. It affects a process yield and a quality. So the invention mentions an optical sensor package and improves the drawback.

SUMMARY OF THE INVENTION

Purpose of the present invention provides an optical sensor chip package that has a gap between the protective layer and the optical sensor chip. Optical sensor chip avoids the pressure from protective layer, when protective layer puts into the forming frame. It damages reliably between pad and metallic traces and avoids glue material dropping optical sensor image sensing area. It forms an un-wanted particle source that isn't easy cleaning. It affects a process yield and a quality and improves thinkable of process yield.

Another purpose that the present invention provides optical sensor chip package that has a method of the light pass though to optical sensor chip protects the optical sensor chip to avoid particle pollution. It also improves the high process yield and reduces the height of optical sensor chip package to achieve lightly and thinly.

To achieve proposes, the present invention provides an optical sensor chip package which composes forming frame that is a cavity has an open windows to achieve light pass; a optical sensor chip which sets in the cavity inside makes use of flip chip method; a protection layer which sets in the bottom of the optical sensor chip has a gap with a optical sensor chip; a plurality of metallic traces which have a electric connection with pads of optical sensor chip extends from forming frame surface; and a light transparent layer sets in the top of the open window.

BRIEF DESCRIPTION OF THE DRAWINGS

The various objects and advantages of the present invention will be more readily understood from the following detailed description when read in conjunction with the appended drawing, in which.

DETAILED DESCRIPTION OF THE PREFERRED EMBODIMENTS

Figure 1:
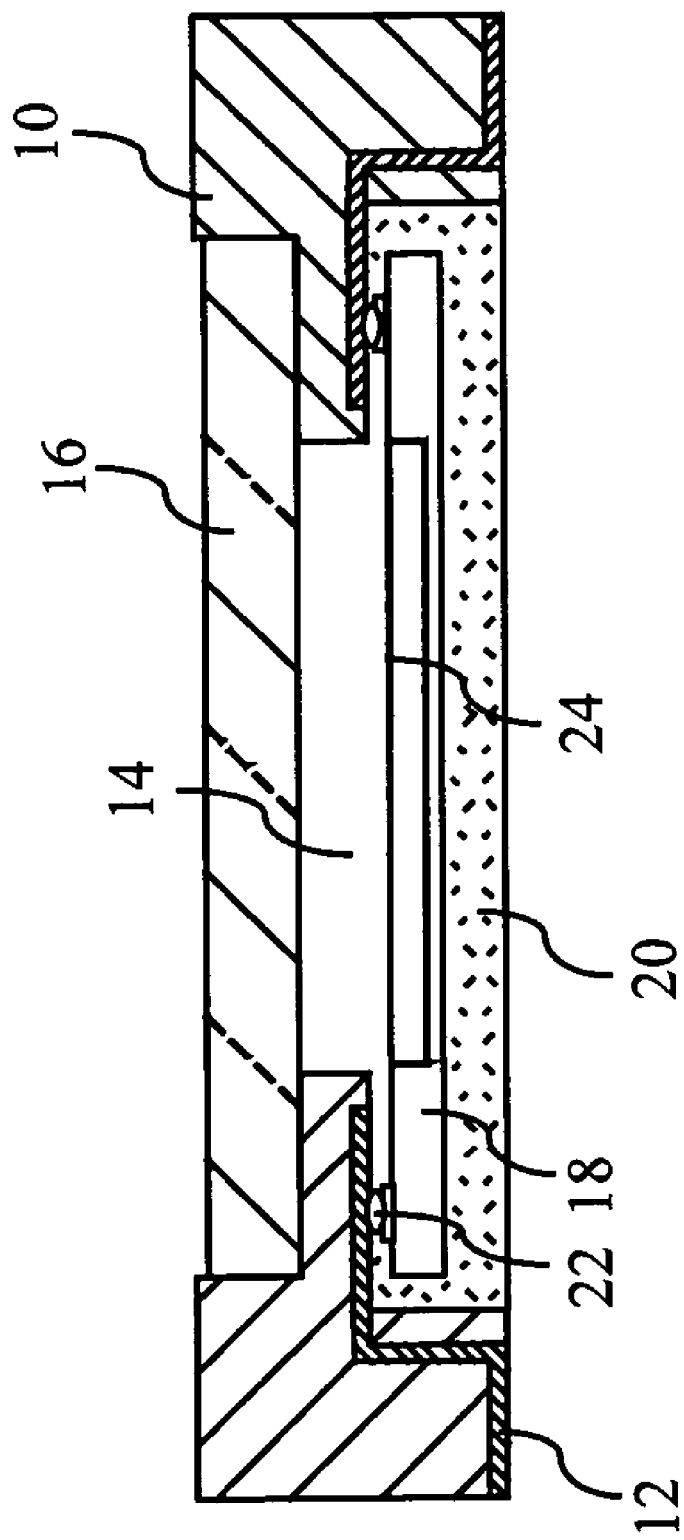
FIG. 1 is a sectional illustration of a conventional optical sensor chip package.
Figure 2:
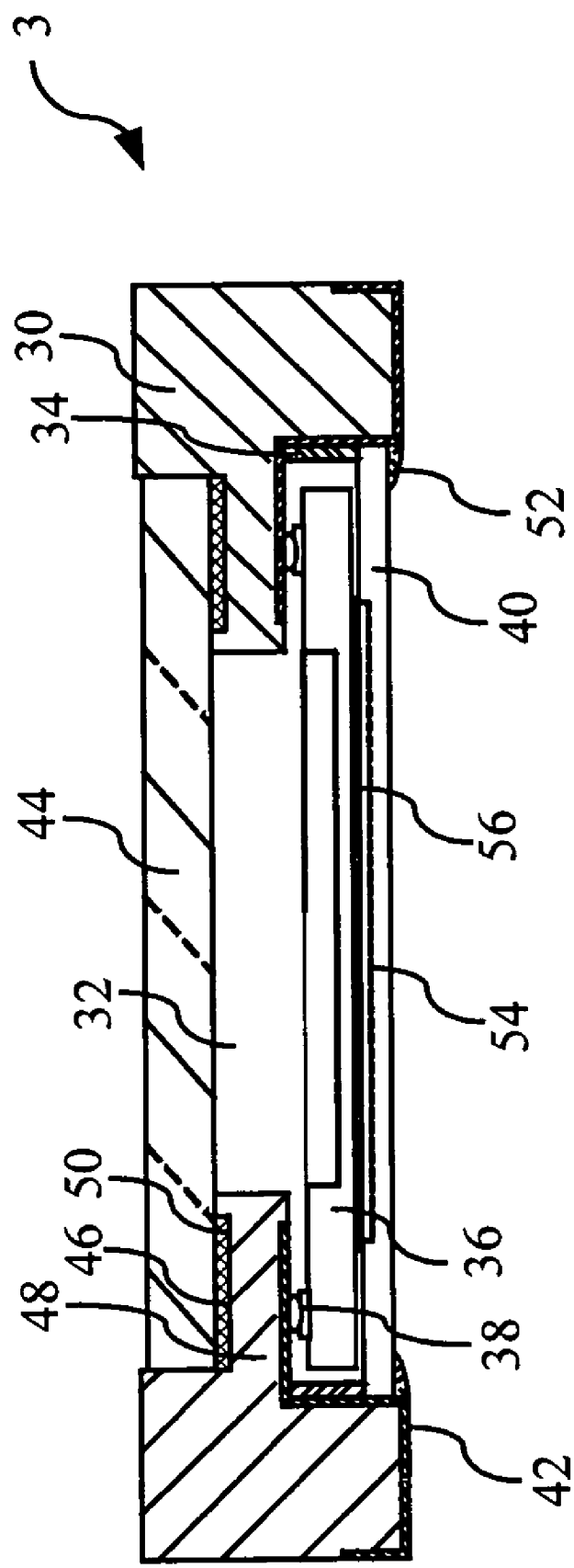
FIG. 2 is a sectional illustration of an optical sensor package according to the present invention.

The present invention relates to optical sensor chip package that has sectional drawing as shown in FIG. 2. The optical sensor chip package 3 is composed of forming frame 30 which is a cavity sets up open window 32 for passing through light source. The cavity has at least one-salient layer 34 which set up an optical sensor chip 36 uses a method of flip chip. Above of the optical sensor chip 36 uses methods of the wire bonding to form metal balls. The metal balls are formed a plurality of pads 38. They are in the cavity of optical sensor chip 36. The salient layer 34 sets a protective layer 40 below. When the protective layer 40 pressures to forming frame 30, the salient layer 34 avoids protective layer pressure to optical sensor chip 36. And a plurality of metallic traces 42 use ultrasonic vibration to form electric connection with pads 38 of optical sensor chip 36. The metallic traces 42 can use metallic framework form a metal slice or electroplating form forming frame 30 surfaces. The metallic traces 42 extend from inner surface sides till bottom of the forming frame and connect to a printed circuit board. The open window 32 of the forming frame 30 covers the light transparent layer 44, such as glass. The glue layer 46 is formed between forming frame 30 above and the light transparent layer 44.

Among of the forming frame 30 have two lugs 48. Each lug 48 sets a groove that glue layer 46 is flow to groove 50 to protect optical sensor chip 36 to avoid pollution. The sealing compound layer is under connection between a forming frame 30 and protective layer 40 and protect optical sensor chip 36. The metal layer 54 is between protective layer 40 and optical sensor chip 36 exercises diffuse heat. The metal layer 54 has a heat spreader 56, ex. Ag, Epoxy Glue, as spread heat. The metal layer 54 and protective layer 40 are all in one. Another, light transparent layer 44 is also filtered especial wavelength range, Ex. far-infrared ray.

Figure 3:
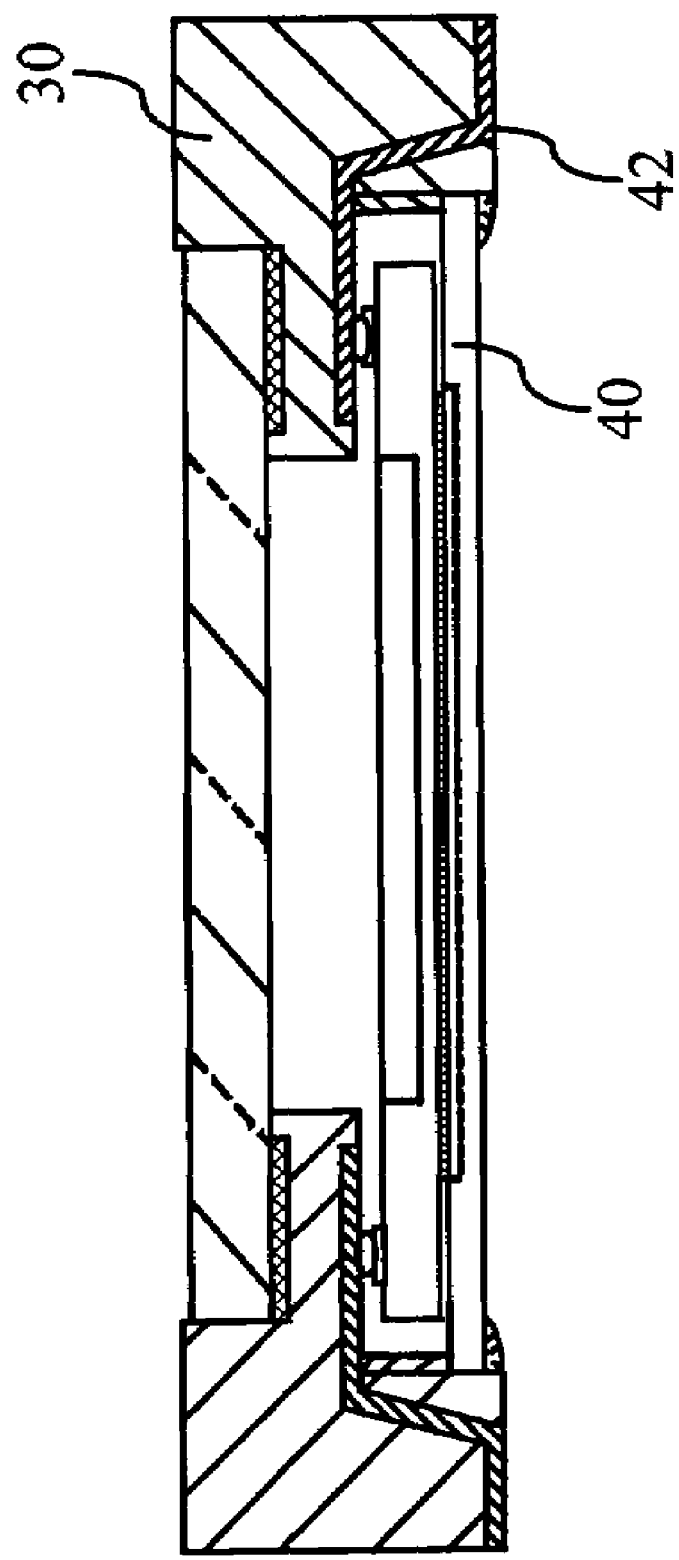
FIG. 3 is a sectional illustration of an optical sensor package according to another embodiment of the present invention.

Another, beside metallic traces 42 is as FIG. 2 to extend to forming frame 30 sides of the surface, it also as FIG. 3. It is extended to forming frame 30 from bottom of the surface above. Whatever metallic traces is extended forming frame from bottom or side, the metallic traces 42 all connect to printed circuit board, ex. PCB or flexible board. The metallic traces 42 which is made use to surface mount Technology (SMT) connect to printed circuit board.

Figure 4:
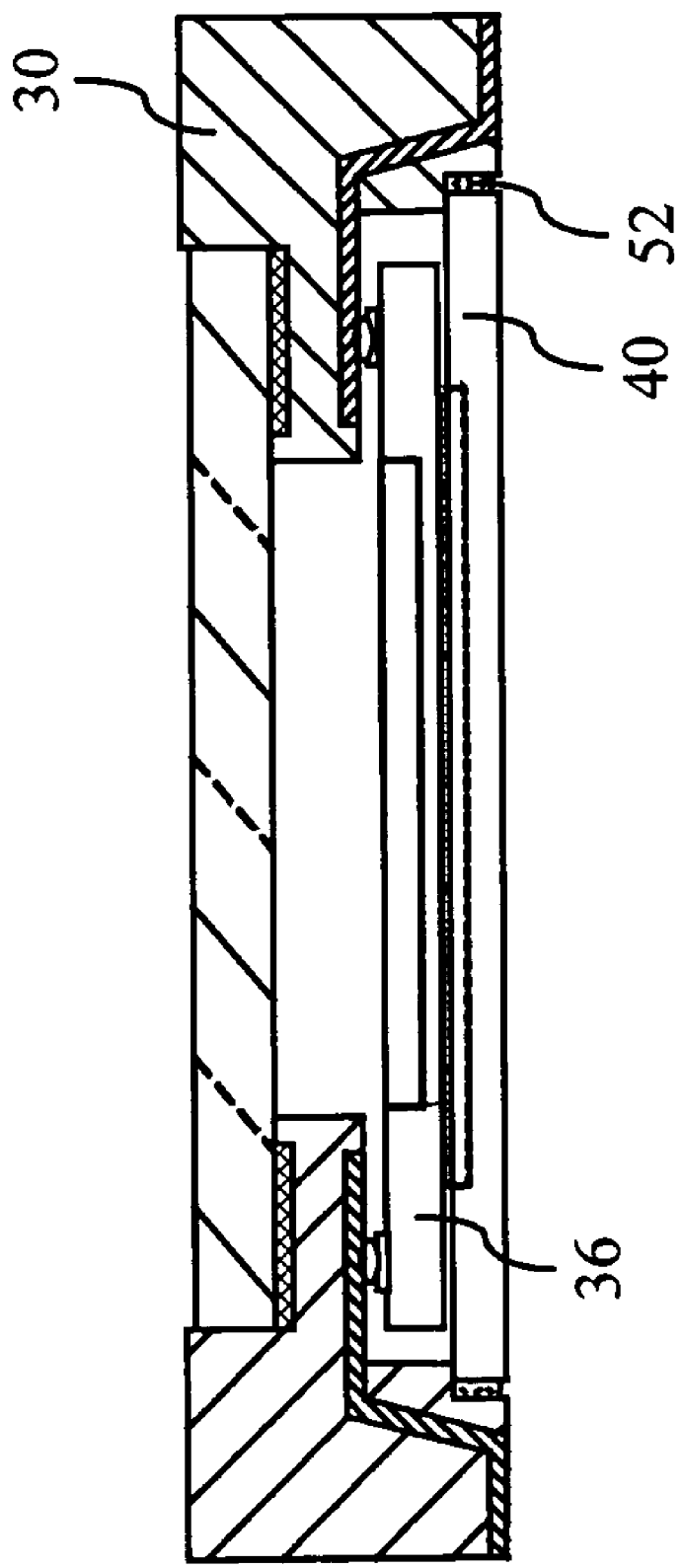
FIG. 4 is a sectional illustration of an optical sensor package according to another embodiment of the present invention.

As FIG. 4, sealing compound layer 52 is sets up gap between forming frame and protective layer 40. It also stuffs side of protective layer 40 and forming frame 30. The Sealing compound layer protect optical sensor chip 36.

The present invention relates to optical sensor chip package which forms gap between protective layer and optical sensor chip. Ex. At least a lug in the cavity of the forming frame. The optical sensor chip avoids the pressure from protective layer, when protective layer puts into the forming frame. It damages reliably between pad and metallic traces and avoids glue material dropping optical sensor image sensing area. It forms an un-wanted particle source that isn't easy cleaning. It also improves the high process yield and reduces the height of optical sensor chip package to achieve lightly and thinly.

Mention of the detail description provides a characteristic of the present invention. It can be useful for understanding this technology area human being. They can use it by this invention description. But it is not only limited in the claims of the present invention but also the same as modifying things of equal effectiveness. It still contains in the claims of the present invention.

What is claimed is:

1. An optical sensor chip package comprising:
   a forming frame that is a cavity has a open windows to achieve light pass and has a plurality of pads;
   a optical sensor chip which sets in the cavity inside makes use of flip chip method;
   a protection layer which sets in the bottom of the optical sensor chip has a gap with a optical sensor chip;
   a plurality of metallic traces which have a electric connection with pads of optical sensor chip extends from the forming frame surface; and
   a light transparent layer which sets on an open window of the forming frame.

2. The optical sensor chip package of claim 1, wherein the pads use wire bonding to connect with material ball.

3. The optical sensor chip package of claim 1, wherein the pad and metallic traces use ultrasonic vibration to form electric connection.

4. The optical sensor chip package of claim 1, wherein the metallic traces extend from surface till bottom of the forming frame so as to connect to a printed circuit board or flexible board.

5. The optical sensor chip package of claim 1, wherein the metallic traces extend from both sides till bottom of the forming frame so as to connect to a printed circuit board or flexible board.

6. The optical sensor chip package of claim 4, wherein the metallic traces use surface mount Technology (SMT) to connect printed circuit board or flexible board.

7. The optical sensor chip package of claim 1, wherein the metallic traces use the electroplating form forming frame surface.

8. The optical sensor chip package of claim 1, wherein the metallic traces are a metallic framework forms a metal slice.

9. The optical sensor chip package of claim 1, wherein the sealing compound layer that lay on the link between forming frame and protection layer protects optical sensor chip.

10. The optical sensor chip package of claim 1, wherein the sealing compound layer at least which lay on the sides between forming frame and protection layer protects optical sensor chip.

11. The optical sensor chip package of claim 1, wherein the material layer which sets in the middle of protection layer and optical sensor chip uses for diffuse heat.

12. The optical sensor chip package of claim 11, wherein the material layer and protection layer are all in one.

13. The optical sensor chip package of claim 1, where the diffuse layer, which lay on the link between protection layer and optical sensor chip, uses for diffuse heat.

14. The optical sensor chip package of claim 13, wherein the diffuse layer is Ag Epoxy Glue.

15. The optical sensor chip package of claim 1, wherein at least the salient layer is in the middle of cavity of forming frame and is a gap among protection layer and optical sensor chip; and, salient layer avoids optical sensor chip pressure from putting forming frame into protection layer.

16. The optical sensor chip package of claim 1, wherein the light transparent layer filter out special wavelengths range.

17. The optical sensor chip package of claim 16, wherein open window layer filter out far-infrared ray.

18. The optical sensor chip package of claim 1, wherein glue layer is between of forming frame and light transparent layer.

19. The optical sensor chip package of claim 18, wherein at least a lug in the forming frame that sets at least a notch in the top makes the glue layer to overflow into the lug and protect against the optical sensor chip pollution.

20. The optical sensor chip package of claim 5, wherein the metallic traces use surface mount Technology (SMT) to connect printed circuit board or flexible board.

* * * * *